United States Patent [19]

Bahl et al.

[11] Patent Number: 4,788,509

[45] Date of Patent: Nov. 29, 1988

[54] PHASE SHIFTER

[75] Inventors: Inder J. Bahl, Roanoke; Gary K. Lewis, Salem, both of Va.

[73] Assignee: ITT Gallium Arsenide Technology Center, a division of ITT Corporation, Roanoke, Va.

[21] Appl. No.: 896,779

[22] Filed: Aug. 15, 1986

[51] Int. Cl.[4] .............................................. H03F 3/60
[52] U.S. Cl. .................................... 330/54; 307/511; 328/19; 330/277; 330/286; 330/295; 332/31 T
[58] Field of Search ................. 330/54, 277, 286, 295; 307/498, 511; 328/16-19, 20, 155, 158, 160; 332/31 T; 333/156, 164; 455/118, 313, 325, 333

[56] References Cited

U.S. PATENT DOCUMENTS 2,593,948  4/1952  Wiegand et al. ............... 330/54 X
3,452,289  6/1969  Ryan ............................. 330/254
4,511,813  4/1985  Pan .............................. 330/277 X
4,549,152  10/1985 Kumar .......................... 330/295 X
4,675,911  6/1987  Sokolov et al. .................. 455/325

Primary Examiner—James B. Mullins
Attorney, Agent, or Firm—Robert A. Walsh; Thomas N. Twomey; Mary C. Werner

[57] ABSTRACT

A multifunction monolithic microwave integrated circuit composed of a plurality of dual gate FET amplifier sections connected between a pair of transmission lines which are adapted to receive one or two input signals. The circuit can be configured, by selective external connections and biasing voltage levels, to function in a number of different modes, such as an amplifier, a mixer, modulator, a variable amplifier, an attenuator, a temperature compensation chip, a frequency multiplier and a phase shifter.

4 Claims, 2 Drawing Sheets

PHASE SHIFTER

BACKGROND OF THE INVENTION

A. Field of the Invention

This invention relates to the field of monolithic microwave integrated circuits (MMIC) and in particular to a multifunction gallium arsenide MMIC chip.

B. Prior Art

The trend in advanced microwave electronics. chips is toward increasing their integration, reliability and radiation hardness and producing them in large volumes to reduce their cost. The monolithic approach toward chip design is the preferred direction to proceed to reach these ends. The use of GaAs in the fabrication of monolithic microwave integrated circuit chips permits monolithic chips to reach these ends more effectively.

An example of a common type of circuit which is required for microwave applications is a distributed amplifier. A GaAs distributed amplifier is disclosed in "A Miniature 2-18 GHz monolithic GaAs distributed amplifier," by Wayne Kennan, Tom Andrade and Charlie Wang, CH 2042-0/840000-0041, IEEE, 1984. In this design, dual gate GaAs FETs are used to form amplifier sections. The first gate of each FET is coupled to a transmission line having an external connection for receiving an RF input signal. The second gate of each FET is electrically coupled to a common output pin and tied to DC to provide gain control.

GaAs MESFET microwave amplification is also taught in "Microwave Field Effect Transistors—1976" by Charles A. Liechti, IEEE Transactions on Microwave Theory and Techniques, Vol. MTT-24, No. 6, June 1976.

"Distributed Amplifiers: Their Time Comes Again" by Wayne Cannon and Northe K Osbrink, Microwaves and RF, November, 1984 teaches a GaAs dual gate FET distributed amplifier, and "Dual Gate MESFET Mixers" by Christos Tsironis, Roman Meier, and Ranier Stahlmann, 0018-9480/84/0300-0248, IEEE, 1984 teaches the use of dual gate MESFETs as a preamplifier. These circuits also are useful primarily for amplifying microwave signals.

Additionally, dual gate GaAs MESFETS have been used to make microwave mixers and modulators. See for example "A Practical Microwave Travelling Wave MESFET Gate Mixer" by O. S. A. Tang and C. S. Aitchison, MTT-S Digest, 0149-645X/85/0000-0605, IEEE, 1985 and Tsironis et al, above.

All of the circuits described are applicable to a narrow range of applications. Each time it is required to produce, for example, a low noise amplifier, a power amplifier, a mixer, an attenuator, a phase shifter, etc., a separate unique engineering design problem is presented. Additionally, application of these circuits to a frequency range other than the frequencies for which they were designed usually requires redesign.

The design and redesign of microwave circuits is a very time-consuming process because of the properties of high frequency signals. The engineering design background required to perform this design work usually includes many years of practical experience with a particular kind of circuit thus making the development of prototype subsystems very expensive.

SUMMARY OF THE INVENTION

A multifunction monolithic microwave integrated circuit is formed of a plurality of dual gate FET amplifier sections. First and second transmission lines are provided with each transmission line having a plurality of matching networks. The first gate of each dual gate FET is coupled to the first transmission line and the first gates are separated from each other by individual matching networks of the first transmission line. The second gates are coupled to the second transmission line and are separated from one another by a matching network of the second transmission line. The outputs of the amplifier sections are coupled to output means which provide an output signal representative of the combined outputs of the amplifier sections.

DETAILED DESCRIPTION OF THE INVENTION

Figure 1:
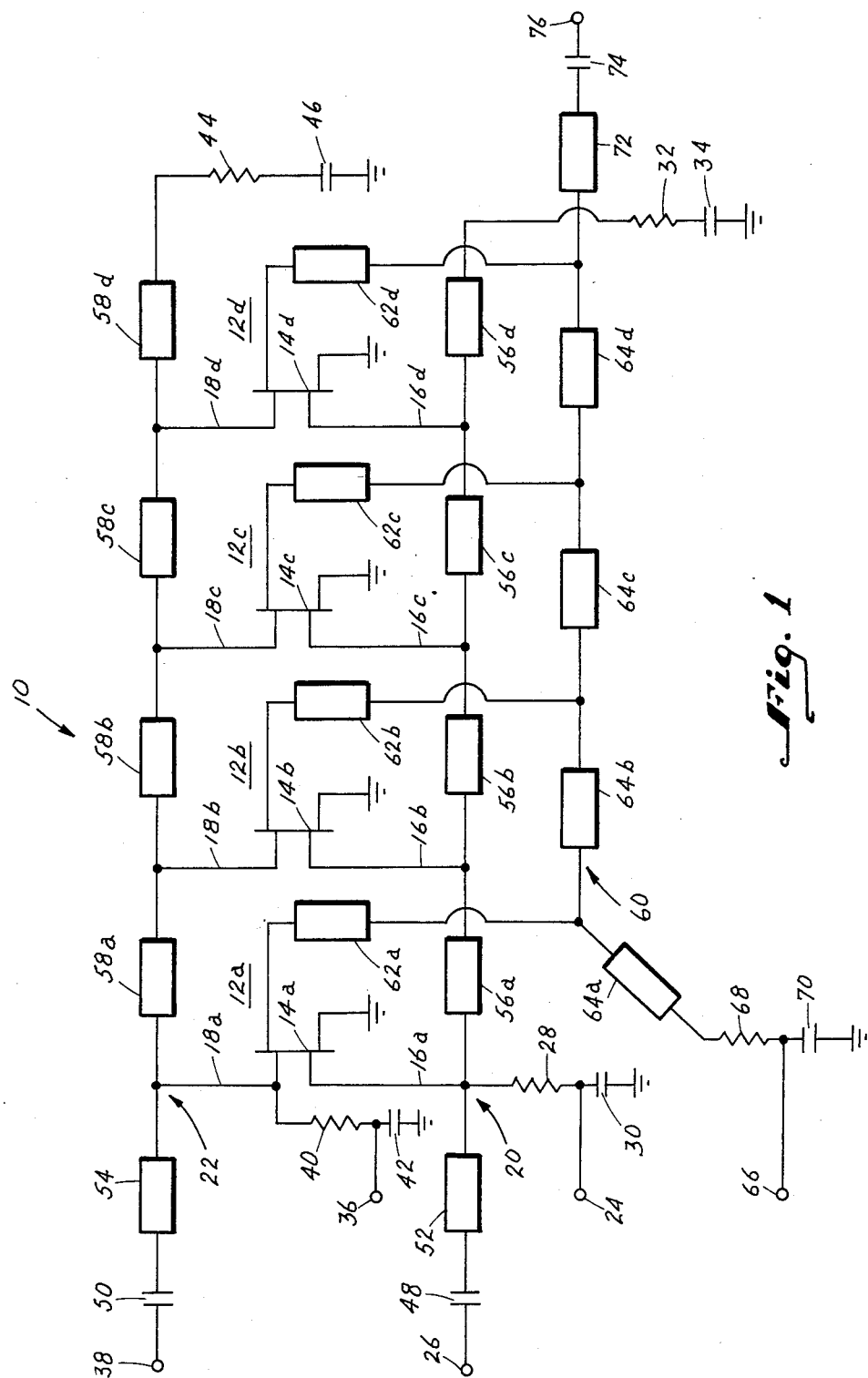
FIG. 1 is a schematic representation of the circuit of the present invention.

Referring to FIG. 1, a multifunction GaAs monolithic microwave integrated circuit (MMIC) 10, constructed in accordance with the present invention, includes a plurality of amplifier sections 12a, 12b, 12c and 12d each having a respective dual gate GaAs MESFET 14a, 14b, 14c and 14d with subhalf micron gate length. MESFET 14a has first and second gates 16a and 18a; MESFET 14b has first and second gates 16b and 18b; MESFET 14c has first and second gates 16c and 18c; and MESFET 14d has first and second gates 16d and 18d.

The multifunction GaAs MMIC of FIG. 1 further includes a first transmission line 20 and a second transmission line 22. First gates 16a, 16b, 16c and 16d are biased by a DC voltage source connected to a node 24 and applied to the first gates by way of transmission line 20. Transmission line 20 is adapted to receive a microwave input signal at an input node 26 and is terminated by a resistor 28 and a capacitor 30 at the input end and by a resistor 32 and a capacitor 34 at the opposite end. Second gates 18a, 18b, 18c and 18d are biased by a DC voltage source connected to a node 36 and applied to the second gates by way of transmission line 22. Transmission line 22 is adapted to receive a microwave input signal at an input node 38 and is terminated by a resistor 40 and a capacitor 42 at the input end and by a resistor 44 and a capacitor 46 at the opposite end.

Transmission lines 20 and 22 include a pair of input capacitors 48 and 50, respectively, and a pair of matching networks 52 and 54, respectively. These input capacitors and matching networks are selected to provide approximately 50 ohms input impedance at input nodes 26 and 38, respectively, over an operating frequency range of 1 to 30 GHz. This permits the multifunction circuit of the present invention to be impedance matched with most conventional microwave circuits over its entire operating range.

First transmission line 20 includes four matching networks 56a, 56b, 56c and 56d coupled end to end at coupling nodes as shown. First gates 16a, 16b, 16c and 16d are coupled to transmission line 20 at the coupling nodes at the ends of matching networks 56a, 56b, 56c and 56d. Each matching network may be modelled as an inductor in series and a shunt capacitor to ground and is matched for an associated amplifier section 12a, 12b, 12c and 12d.

Similarly, transmission line 22 includes four matching networks 58a, 58b, 58c and 58d coupled end to end at coupling nodes as shown. Second gates 18a, 18b, 18c and 18d are coupled to transmission line 22 at the coupling nodes at the ends of matching networks 58a, 58b, 58c and 58d. Each matching network 58a, 58b, 58c and 58d is matched for an associated amplifier section 12a, 12b, 12c and 12d.

The multifunction GaAs MMC of FIG. 1 further includes output means coupled to the outputs of amplifier sections 12a, 12b, 12c and 12d for providing an output signal representative of the combined outputs of the amplifier sections. Such means include a drain transmission line 60 and a plurality of drain matching networks 62a, 62b, 62c and 62d at the drains of MESFETS 14a, 14b, 14c, and 14d, respectively, coupling the MESFETS to the drain transmission line. Drain transmission line 60 includes four matching networks 64a, 64b, 64c and 64d. A drain bias is applied at a node 66. A resistor 68 and a capacitor 70 provide termination at this end of drain transmission line 60, while permitting a DC bias to be applied to the drains of MESFETS 14a, 14b, 14c and 14d. A matching network 72 and a capacitor 74 are included at the opposite end of drain transmission line 60 to provide an output impedance of 50 ohms at an output node 76. Drain matching networks 62a, 62b, 62c and 62d, as well as matching networks 64a, 64b, 64c and 64d of the drain transmission line, also are matched for the associated amplifier sections 12a, 12b, 12c and 12d.

The associated matching networks of transmission lines 12 and 14 are selected taking into account the presence of each other as well as the associated drain matching networks and the other parameters of the associated amplifier section, such as the gate source capacitance of the MESFET. These parameters may vary from one amplifier section to another. As a result, different matching networks may be required for each of the amplifier sections.

This process of selecting values for all matching networks is best performed by an optimization process which models the multifunction circuit of the present invention and which may be run on a computer. All matching networks, including matching networks 64a, 64b, 64c and 64d of drain transmission line 60 are considered in this model and are selected to optimize matching of input and output impedances of each amplifier section. The optimization of matching networks within each amplifier section takes into account the presence of the sections which precede and follow.

All matching networks are selected to accommodate large variations in gate source capacitance and output impedance for each amplifier section over an operating range of 1 to 30 GHz. Gate source capacitance and the output resistance of MESFETS 14a, 14b, 14c and 14d can vary by 100% when the MESFETS are biased from near pinch off to approximately ½ drain source saturation current, and the optimization process takes these large variations into account over the entire operating range for multifunction applications.

Figure 2:
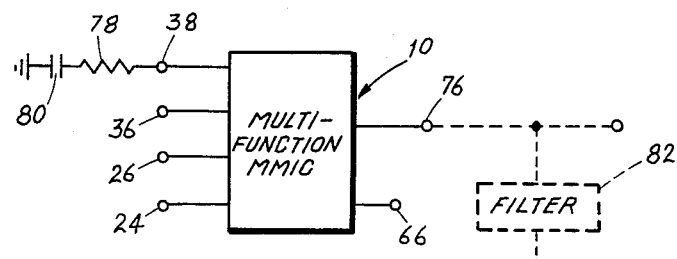
FIG. 2 is a representation of the circuit of FIG. 1 configured as an amplifier or attenuator or modulator or frequency multiplier.

FIG. 2 shows the multifunction circuit 10 of FIG. 1 configured to function as a distributed amplifier. In the distributed amplifier function, an external DC biasing voltage source is applied at node 24 and is coupled to the first gates through transmission line 20. In addition, an external DC biasing voltage source is applied to node 36 and coupled to the second gates by transmission line 22.

The biasing levels on nodes 24 and 36 are negative, typically approximately minus 1 volt. A drain bias of approximately 3-4 volts is applied to node 66. The levels on each node are adjusted independently to produce drain source currents in MESFETS 14a, 14b, 14c and 14d which are in the linear operating region of approximately 10-15% of the drain source saturation current for low power amplification applications. For medium power amplification, the biasing levels are adjusted to produce a drain source current in the linear operating region of approximately 50% of the drain source saturation current. Thus, the drain source currents are in the linear operating region of the MESFETS for amplification functions.

A microwave input source signal is applied to node 26 and an output signal is provided at node 76 which is the input source signal with a gain determined by the biasing levels at nodes 24 and 36. Input node 38, instead of receiving a microwave input source signal, is provided, in this configuration of the multifunction circuit, with an external termination composed of a resistor 78 and a capacitor 80. This termination is 50 ohms because the multifunction circuit is optimized allowing for 50 ohms at all input and output nodes. The configuration shown in FIG. 2 is better adapted to low noise, broad band, low power and medium power amplification rather than to narrow band amplification.

A variable voltage may be applied to nodes 24 and 36 to cause the amplifier to function as a variable gain amplifier or as a variable attenuator. This configuration may also function as a programmable attenuator by providing a programmable power supply as a biasing voltage source or as an automatic gain control. It is preferable to hold the biasing at the first gates fixed and to vary the biasing at the second gates when implementing a variable function. This configuration may also function as a temperature compensation chip by providing, either at node 24 or at node 36, biasing with a voltage divider having a thermistor.

In an alternate embodiment, which is not shown, the functions of the first gates and the second gates may be reversed in the amplifier's circuit. In such an embodiment, input node 26 of transmission line 20 is terminated and an input source signal is applied to input node 38 of transmission line 22. The output signal at node 76 is the input signal applied to node 38 with a gain determined by the biasing levels at nodes 24 and 36.

The biasing voltage source applied to the second gates by way of node 36 may be adapted to turn the drain source currents of the MESFETS on and off under the control of an external modulating signal. In this configuration, multifunction circuit 10 functions as a modulator to modulate the input signal applied at node 26. The output modulated signal is provided at output node 76.

If the MESFETs are biased, by way of node 36, in the nonlinear operating region near pinch off, the configuration shown in FIG. 2 can function as a harmonic generator. In the harmonic generator function, the signal provided at output node 76 contains harmonics of the input signal which is applied to node 26. By providing a filter 82 at output node 76, a single harmonic can be selected from the plurality of harmonics provided at the output node and the harmonic generator functions as a frequency multiplier. For example, if filter 82 is adapted to select for the third harmonic, multifunction circuit 10 functions as a frequency tripler.

Figure 3:
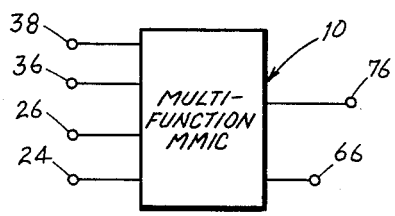
FIG. 3 is a representation of the circuit of FIG. 1 configured as a mixer or up-converter.

In the configuration shown in FIG. 3, multifunction circuit 10 functions a a mixer to mix the input signals applied to input nodes 26 and 38. DC biasing voltage sources are applied to both biasing nodes 24 and 36. The level of biasing on nodes 24 and 36 is selected to produce a bias current which is near the pinch off of the MESFETS. The level of biasing on node 66 is selected to produce a drain source current which is less than 10% of the drain source saturation current to cause the MESFETS to operate in a nonlinear region.

The output signal, provided at node 76, is an IF signal mixing product when both input signals are RF. When one of the input signals supplied to input nodes 26 or 38 is an RF signal and the other is an IF signal, the configuration of FIG. 3 functions as an up converter in which the output signal provided at node 76 has a frequency which is the sum of the frequencies of the input signals applied at nodes 26 and 38.

Figure 4:
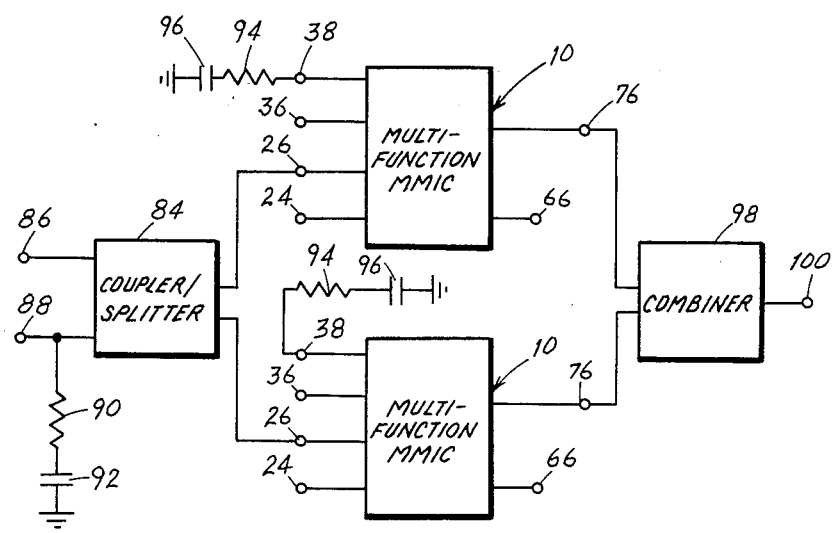
FIG. 4 is a representation of the circuit of FIG. 1 configured as a phase shifter.

In FIG. 4, two MMIC's 10 function together as a phase shifter. A conventional 3 db splitter/coupler 84 couples an RF input source signal, applied at a coupler input 86, to nodes 26 of MMIC's 10. Coupler/splitter 84 is selected to produce a phase shift of 90° for the signals applied to nodes 26. A second input node 88 to coupler/splitter 84 is terminated with 50 ohms by a resistor 90 and a capacitor 92.

With this arrangement, the first transmission line of each MMIC 10 receives, from the outputs of coupler/splitter 84, the input source signal applied at input 86. Biasing nodes 24 of both MMIC's 10 are coupled to a single biasing source voltage or to individual biasing source voltages to provide biasing for the first gates in each MMIC 10. Biasing nodes 36 of both MMIC's 10 are biased in a similar manner to provide biasing for the second gates of each MMIC 10. Input nodes 38 of both MMIC's 10 are terminated with conventional 50 ohm terminations, each including a resistor 94 and a capacitor 96. Drain biasing is applied at nodes 66.

A conventional combiner 98 receives the output signals at both output nodes 76 and combines them in a conventional manner to provide a phase shifted output signal at a combiner output node 100. The phase shift of the configuration shown in FIG. 4 may be varied at combiner output node 100 by varying the biasing voltage source levels applied to nodes 24 and 36. Alternatively, the biasing voltage source applied to nodes 36 can be kept fixed and the biasing voltage source applied to nodes 24 can be varied or the biasing voltage source applied to nodes 24 can be kept fixed and the biasing voltage source applied to nodes 36 can be varied. In the configuration of FIG. 4, MMIC 10 can thus function as a variable phase shifter or a programmable phase shifter.

When the configuration of FIG. 4 is provided with a coupler/splitter 84 which applies 180° phase shifted signals to input nodes 26 of MMIC's 10 and the MMIC's are biased as previously described for the biasing of the mixer function, a balanced doubler is produced. In the balanced doubler configuration, the output signal, provided at output node 100, has a frequency twice that of the frequency of the input signal applied at input 86.

The foregoing has set forth an exemplary and preferred embodiment of the present invention. It will be understood, however, that various alternatives will occur to those of ordinary skill in the art without departure from the spirit and scope of the present invention.

We claim:

1. A multifunction circuit configured to function as a phase shifter comprising:
    a first monolithic microwave integrated circuit including
        a plurality of FET amplifier sections, each section having an output and a FET with a first and a second gate;
        output means coupled to the outputs of said amplifier sections for providing an output signal representative of the combined output of said amplifier sections;
        a first transmission line having a plurality of matching networks and first input means adapted for receiving a microwave input signal, said first gates connected to said first transmission line and separated one from another by a respective matching network of said first transmission line and first biasing means for applying a bias to said first gates;
        a second transmission line having a plurality of matching networks and second input means adapted for receiving a microwave input signal, said second gates connected to said second transmission line and separated one from another by a respective matching network of said second transmission line and second biasing means for applying a bias to said second gates, said first and second biasing means selecting drain source current and thereby an operating region of said FETs;
        a first biasing voltage source coupled to said first biasing means;
        a second biasing voltage source coupled to said second biasing means;
    a second multifunction monolithic microwave integrated circuit including
        a plurality of FET amplifier sections, each section having an output and a FET with a first and a second gate;
        output means coupled to the outputs of said amplifier sections for providing an output signal representative of the combined outputs of said amplifier section;
        a first transmission line having a plurality of matching networks and first input means adapted for receiving a microwave input signal, said first gates connected to said first transmission line and separated one from another by a respective matching network of said first transmission line and first biasing means for applying a bias to said first gates;
        a second transmission line having a plurality of matching networks and second input means adapted for receiving a microwave input signal, said second gates connected to said second transmission line and separated one from another by a respective matching network of said second transmission line and second biasing means for applying a bias to said second gates, said first and second biasing means selecting drain source current and thereby an operating region of said FETs;
        a first biasing voltage source coupled to said first biasing means;

a second biasing voltage source coupled to said second biasing means;

a coupler having a coupler input node for receiving a microwave input signal and two coupler output nodes, each coupler output node individually connected to one of said input means of each of said monolithic microwave integrated circuits, respectively; and combiner means having two combiner inputs each coupled to said output means of one of said multifunction monolithic microwave integrated circuits for combining the respective output signals and providing a phase shifted representation of said coupler input signal.

2. The multifunction circuit of claim 1 wherein at least one of said first and second biasing voltage sources is adapted to apply a varying biasing voltage level to provide output signals of varying phase shift.

3. A phase shifter comprising:

a first monolithic microwave integrated circuit including a plurality of FET amplifier sections, each section having an output and a FET with a first and a second gate;

output means coupled to the outputs of said amplifier sections for providing an output signal representative of the combined outputs of said amplifier sections;

a first transmission line having a plurality of matching networks and first input means adapted for receiving a microwave input signal, said first gates connected to said first transmission line and separated one from another by a respective matching network of said first transmission line and first biasing means for applying a bias to said first gates;

a second transmission line having a plurality of matching networks and second input means adapted for receiving a microwave input signal, said second gates connected to said second transmission line and separated one from another by a respective matching network of said second transmission line and second biasing means for applying a bias to said second gates, said first and second biasing means selecting drain source current and thereby an operating region or said FETs;

a first biasing voltage source coupled to said first biasing means;

a second biasing voltage source coupled to said second biasing means;

a second monolithic microwave integrated circuit including a plurality of FET amplifier sections, each section having an output and a FET with a first and a second gate;

output means coupled to the outputs of said amplifier sections for providing an output signal representative of the combined outputs of said amplifier sections;

a first transmission line having a plurality of matching networks and first input means adapted for receiving a microwave input signal, said first gates connected to said first transmission line and separated one from another by a respective matching network of said first transmission line and first biasing means for applying a bias to said first gates;

a second transmission line having a plurality of matching networks and second input means adapted for receiving a microwave input signal, said second gates connected to said second transmission line and separated one from another by a respective matching network of said second transmission line and second biasing means for applying a bias to said second gates, said first and second biasing means selecting drain source current and thereby an operating region of said FETs;

a first biasing voltage source coupled to said first biasing means;

a second biasing voltage source coupled to said second biasing means;

a coupler having a coupler input node for receiving a microwave input signal and two coupler output nodes, each coupler output node individually connected to one of said input means of each of said monolithic microwave integrated circuits, respectively; and combiner means having two combiner inputs each coupled to said output means of one of said monolithic microwave integrated circuits for combining the respective output signals and providing a phase shifted representation of said coupler input signal.

4. A phase shifter comprising:

a first circuit including a plurality of FET amplifier sections, each section having an output and a FET with a first and a second gate;

output means coupled to the outputs of said amplifier sections for providing an output signal representative of the combined outputs of said amplifier sections;

a first transmission line having a plurality of matching networks and first input means adapted for receving a microwave input signal, said first gates connected to said first transmission line and separated one from another by a respective matching network of said first transmission line and first biasing means for applying a bias to said first gates;

a second transmission line having a plurality of matching networks and second input means adapted for receiving a microwave input signal, said second gates connected to said second transmission line and separated one from another by a respective matching network of said second transmission line and second biasing means for applying a bias to said second gates, said first and second biasing means selecting drain source current and thereby an operating region of said FETs;

a first biasing voltage source coupled to said first biasing means;

a second biasing voltage source coupled to said second biasing means;

a second circuit including a plurality of FET amplifier sections, each section having an output and a FET with a first and a second gate;

output means coupled to the outputs of said amplifier sections for providing an output signal representative of the combined outputs of said amplifier sections;

first transmission line having a plurality of matching networks and first input means adapted for receiving a microwave input signal, said first gates connected to said first transmission line and separated one from another by a respective matching network of said first transmission line and first biasing means for applying a bias to said first gates;

a second transmission line having a plurality of matching networks and second input means adapted for receiving a microwave input signal, said second gates connected to said second transmission line and separated one from another by a respective matching network of said second transmission line and second biasing means for applying a bias to said second gates, said first and second biasing means selecting drain source current and thereby an operating region of said FETs;

a first biasing voltage source coupled to said first biasing means;

a second biasing voltage source coupled to said second biasing means;

a coupler having a coupler input node for receiving a microwave input signal and two coupler output nodes, each coupler output node individually connected to one of said input means of each of said circuits, respectively; and combiner means having two combiner inputs each coupled to said output means of one of said circuits for combining the respective output signals and providing a phase shifted representation of said coupler input signal.

* * * * *